US010099321B2

United States Patent
Inoue et al.

(10) Patent No.: US 10,099,321 B2
(45) Date of Patent: Oct. 16, 2018

(54) FLUX AND SOLDER PASTE

(71) Applicant: HARIMA CHEMICALS, INC., Hyogo (JP)

(72) Inventors: Kosuke Inoue, Hyogo (JP); Tetsuyuki Shigesada, Hyogo (JP); Kenichi Takeshima, Aichi (JP); Takuji Sukekawa, Aichi (JP); Masao Murata, Aichi (JP)

(73) Assignee: HARIMA CHEMICALS, INC., Hyogo (JP)

( * ) Notice: Subject to any disclaimer, the term of this patent is extended or adjusted under 35 U.S.C. 154(b) by 411 days.

(21) Appl. No.: 14/655,133

(22) PCT Filed: Dec. 13, 2013

(86) PCT No.: PCT/JP2013/083463
§ 371 (c)(1),
(2) Date: Jun. 24, 2015

(87) PCT Pub. No.: WO2014/103751
PCT Pub. Date: Jul. 3, 2014

(65) Prior Publication Data
US 2015/0343571 A1 Dec. 3, 2015

(30) Foreign Application Priority Data

Dec. 26, 2012 (JP) ................................ 2012-282542

(51) Int. Cl.
| | | |
|---|---|---|
| *B23K 35/26* | (2006.01) | |
| *B23K 35/365* | (2006.01) | |
| *B23K 35/36* | (2006.01) | |
| *B23K 35/362* | (2006.01) | |
| *C22C 13/00* | (2006.01) | |
| *H05K 3/34* | (2006.01) | |
| *B23K 35/02* | (2006.01) | |

(52) U.S. Cl.
CPC ............ *B23K 35/26* (2013.01); *B23K 35/025* (2013.01); *B23K 35/0222* (2013.01); *B23K 35/0244* (2013.01); *B23K 35/262* (2013.01); *B23K 35/36* (2013.01); *B23K 35/362* (2013.01); *B23K 35/365* (2013.01); *B23K 35/3612* (2013.01); *B23K 35/3613* (2013.01); *C22C 13/00* (2013.01); *H05K 3/3489* (2013.01)

(58) Field of Classification Search
CPC .................................................. B23K 35/3613
See application file for complete search history.

(56) References Cited

U.S. PATENT DOCUMENTS

| | | | |
|---|---|---|---|
| 8,572,670 B2 | 10/2013 | Asami et al. | |
| 8,679,263 B2 | 3/2014 | Aihara et al. | |
| 2008/0053572 A1* | 3/2008 | Sanji .................. | B23K 35/0244 148/23 |
| 2011/0036628 A1 | 2/2011 | Aihara et al. | |
| 2014/0053954 A1* | 2/2014 | Inoue ................... | B23K 35/025 148/24 |

FOREIGN PATENT DOCUMENTS

| | | | |
|---|---|---|---|
| EP | 2243592 A1 | 10/2010 | |
| EP | 2692479 A1 | 2/2014 | |
| JP | 05212584 A | 8/1993 | |
| JP | 5228689 A | 9/1993 | |
| JP | 2003264367 A | 9/2003 | |
| JP | 2008062252 A | 3/2008 | |
| JP | WO 2012132034 A1 * | 10/2012 | ........... B23K 35/025 |
| WO | 2009104639 A1 | 8/2009 | |
| WO | 2012132034 A1 | 10/2012 | |

OTHER PUBLICATIONS

International Search Report for PCT/JP2013/083463 dated Mar. 18, 2014.
English Abstract for JPH05228689, Publication Date: Sep. 7, 1993.
English Abstract for JPH05212584, Publication Date: Aug. 24, 1993.
Supplementary European Search Report for EP13866687 dated Jul. 5, 2016.
English Abstract for JP2003264367, Publication Date: Sep. 19, 2003.

* cited by examiner

*Primary Examiner* — Colleen P Dunn
*Assistant Examiner* — Rajinder Bajwa
(74) *Attorney, Agent, or Firm* — Millen White Zelano and Branigan, PC; Csaba Henter

(57) ABSTRACT

A soldering flux of the present invention contains, as a base resin, an acrylic resin (A) having an acid value of 0 to 70, and an acrylic resin (B) having an acid value of 30 to 230. The acrylic resin (A) is obtained by polymerization of a monomer mixture containing alkyl(meth)acrylate having an alkyl group having carbon atoms of 12 to 23. The acrylic resin (B) is obtained by polymerization of a monomer mixture containing alkyl(meth)acrylate having an alkyl group having carbon atoms of 6 to 10. The acid value of the acrylic resin (B) is higher than the acid value of the acrylic resin (A), and a difference between these two resins is 15 or more.

19 Claims, No Drawings

FLUX AND SOLDER PASTE

TECHNICAL FIELD

The present invention relates to a soldering flux for use in solder joining of circuit components or the like onto a circuit board, such as a printed circuit board of an electronic device, as well as a solder paste composition using the soldering flux.

BACKGROUND ART

Various kinds of soldering fluxes and solder paste compositions have conventionally been used for solder joining of electronic circuit components, or the like. Particularly, the flux removes metal oxide on solder and on a substrate surface, and also prevents reoxidation of metal during soldering. Hence, the flux reduces surface tension of the solder and is therefore indispensable to satisfactorily perform the soldering.

However, the conventional flux and solder paste composition may cause the problem that cracks occur in a flux residue after the soldering and water enters the cracks, thus producing a short-circuit defect between component leads. There is a high probability that this problem occurs particularly on an on-vehicle substrate subjected to a large temperature difference and large vibration during use.

The method for applying solder paste can be roughly classified into printing method and discharge method. The printing method is one in which a metal mask, a silk screen, or the like, each having holes disposed in soldering portions, is mounted on a printed circuit board, and solder paste is applied from thereabove. The discharge method is one in which solder paste is applied to the soldering portions one by one by using a dispenser or the like. There arises a disadvantage that the application is not performable on a fine-pitch pattern by the discharge method. For example, the printing method is employed in solder joining of electronic circuit components or the like to a fine-pitch circuit board.

Mounting technology is highly densified with downsizing electronic devices, and there is an increasing trend towards a finer pitch. Therefore, the solder paste is required to have excellent printability (transfer performance) in addition to conventionally required characteristics (stability, reliability, and the like). For example, when using the metal mask, the printability is to efficiently transfer to the substrate the solder paste adhered to a wall surface or the like of an opening in the metal mask. Several means, such as miniaturization of metal particle size, and increasing the amount of wax, have been proposed so far in order to improve the printability. Although the miniaturization of metal particle size ensures improving the printability, "storage stability" and "wettability" are poor. The increasing the amount of wax makes it difficult to adjust viscosity and the wettability is apt to be poor.

The present applicant has found so far that a thermoplastic acrylic resin having glass transfer temperature of less than −50° C. is used as a base resin in order to suppress cracks of the flux residue, and that an active action can be promoted when the acid value of the thermoplastic acrylic resin is 50 mg KOH/g or more (Patent Document 1).

Patent Document 2 describes that a resin having acid value of 50 mg KOH/g or less is added to solder paste in order to improve washability against the flux residue after soldering, that the resin is rosin obtained by purifying a natural resinpine tree gum, and that a resin having a high acid value is mixed in order to compensate for the active action of the resin having a low acid value. However, there is no description of the necessity for improving the printability, and there is no description of the use of a resin other than the rosin. The flux residue is to be removed by washing, and hence it is difficult to improve the crack resistance of the flux residue.

PRIOR ART DOCUMENTS

Patent Documents

Patent Document 1: Japanese Unexamined Patent Publication No. 2008-62252
Patent Document 2: Japanese Unexamined Patent Publication No. H5-212584

SUMMARY OF THE INVENTION

Problems to be Solved by the Invention

An object of the present invention is to provide a soldering flux that exerts excellent effect in terms of all of the printability and wettability of solder paste, and the crack resistance of the flux residue, as well as a solder paste composition using the soldering flux.

Means for Solving the Problems

The present inventor has conducted intensive research to solve the foregoing problems and has completed the present invention by finding solutions made of the following configurations.

(1) A soldering flux contains, as a base resin, an acrylic resin (A) having an acid value of 0 to 70, and an acrylic resin (B) having an acid value of 30 to 230. The acrylic resin (A) is obtained by polymerization of a monomer mixture containing alkyl(meth)acrylate having an alkyl group having carbon atoms of 12 to 23. The acrylic resin (B) is obtained by polymerization of a monomer mixture containing alkyl (meth)acrylate having an alkyl group having carbon atoms of 6 to 10. The acid value of the acrylic resin (B) is higher than the acid value of the acrylic resin (A), and a difference between the acid values of these two resins is 15 or more.

(2) In the soldering flux as described in the above (1), a content of the acrylic resin (A) is 10 to 30% by mass in a total amount of flux, and a content of the acrylic resin (B) is 10 to 30% by mass in the total amount of flux.

(3) In the soldering flux as described in the above (1) or (2), the acrylic resin (A) is an acrylic resin obtained by polymerization of a monomer mixture containing at least 50% by mass of alkyl (meth)acrylate having an alkyl group having carbon atoms of 12 to 23.

(4) In the soldering flux as described in any one of the above (1) to (3), the acrylic resin (B) is an acrylic resin obtained by polymerization of a monomer mixture containing at least 50% by mass of alkyl (meth)acrylate having an alkyl group having carbon atoms of 6 to 10.

(5) In the soldering flux as described in any one of the above (1) to (4), the acrylic resin (A) has a weight average molecular weight of 30000 or less.

(6) In the soldering flux as described in any one of the above (1) to (5), the acrylic resin (B) has a weight average molecular weight of 30000 or less.

(7) A solder paste composition contains the soldering flux as described in any one of the above (1) to (6), and solder alloy powder.

Effect of the Invention

The soldering flux of the present invention exerts excellent effect in terms of all of the printability and wettability of the solder paste, and the crack resistance of the flux residue.

PREFERRED EMBODIMENTS FOR CARRYING OUT THE INVENTION (Soldering Flux)

A soldering flux of the present invention (hereinafter generally referred to simply as "flux") contains, as a base resin, an acrylic resin (A) and an acrylic resin (B) having different acid values.

The acrylic resins (A) and (B) are respectively polymers obtained by polymerization of a monomer mixture containing alkyl (meth)acrylate. In the present specification, "(meth)acrylate" implies acrylate or methacrylate.

The acrylic resin (A) is capable of exerting the effect of the present invention as long as it is obtained by polymerization of a monomer mixture containing at least 50% by mass of alkyl(meth)acrylate having an alkyl group having carbon atoms of 12 to 23. The acrylic resin (B) is capable of exerting the effect of the present invention as long as it is obtained by polymerization of a monomer mixture containing at least 50% by mass of alkyl(meth)acrylate having an alkyl group having carbon atoms of 6 to 10.

Examples of the alkyl (meth)acrylate having the alkyl group having the carbon atoms of 12 to 23 include 2,2-dimethyllauryl(meth)acrylate, 2,3-dimethyllauryl(meth)acrylate, 2,2-dimethylstearyl(meth)acrylate, 2,3-dimethylstearyl(meth)acrylate, isolauryl(meth)acrylate, isomyristyl (meth)acrylate, isostearyl(meth)acrylate, and isobehenyl (meth)acrylate. These alkyl(meth)acrylates may be used alone, or two or more kinds of these may be used together. Among others, the alkyl(meth)acrylate having the alkyl group having the carbon atoms of 12 to 20 is preferred.

Examples of the alkyl (meth)acrylate having the alkyl group having the carbon atoms of 6 to 10 include hexyl (meth)acrylate, 2-ethylhexyl(meth)acrylate, octyl(meth)acrylate, and nonyl(meth)acrylate. These alkyl(meth)acrylates may be used alone, or two or more kinds of these may be used together.

Besides the above alkyl (meth)acrylates, other monomers that are copolymerizable with these alkyl(meth)acrylates may be used. Examples of these other monomers include non-ionic monomers (for example, acryl amide, styrene, α-olefin, alkyl(meth)acrylates having an alkyl group having carbon atoms of 1 to 5 (methyl(meth)acrylate, ethyl(meth)acrylate, hydroxyethyl(meth)acrylate, and butyl(meth)acrylate)), and anionic monomers (for example, acrylic acid, methacrylic acid, and itaconic acid).

The acid value of the acrylic resin is determined by a content of an organic acid monomer (for example, acrylic acid, methacrylic acid, etc.) in a monomer ingredient. That is, when the monomer ingredient contains only the alkyl (meth)acrylate and the nonionic monomer, an obtained acrylic resin has an acid value of 0 mg KOH/g, and the acid value increases with increasing the content of the organic acid monomer.

The present invention has a characteristic feature that the acid value of the acrylic resin (B) is higher than the acid value of the acrylic resin (A) and a difference between these two resins is 15 or more. The acrylic resin (A) has an acid value of 0 to 70 mg KOH/g, preferably 20 to 50 mg KOH/g. The acrylic resin (B) has an acid value of 30 to 230 mg KOH/g, preferably 60 to 150 mg KOH/g.

The method for synthesizing the acrylic resins (A) and (B) is not particularly limited, and a well-known method may be employed. For example, the monomer ingredient constituting the acrylic resins (A) and (B) may be subjected to radical polymerization using solvent, polymerization initiator, chain transfer agent, and the like as necessary. The polymerization initiator used for the radical polymerization is not particularly limited as long as it is a compound that decomposes to generate radicals. Examples thereof include azo type initiators and peroxide type initiators. Among others, azo type initiators, such as azobisisobutyronitrile (AIBN), azobismethylbutyronitrile (ABNE), and azobisdimethylvaleronitrile (ABNV) are preferred.

The acrylic resins (A) and (B) preferably have a weight average molecular weight of 30000 or less, more preferably 5000 to 30000. Owing to the acrylic resins (A) and (B) having the weight average molecular weight of 30000 or less, wettability is further improved and their adhesion to a squeegee is far less likely to occur. It is, of course, possible to use the acrylic resins (A) and (B) having different weight average molecular weights.

The weight average molecular weight is usually measured with a gel permeation chromatography (GPC).

A content of acrylic resin (A) is 10 to 30% by mass, preferably 10 to 25% by mass in a total amount of flux. A content of acrylic resin (B) is also 10 to 30% by mass, preferably 10 to 25% by mass in the total amount of flux. The printability and wettability of the solder paste and the crack resistance of the flux residue can be further improved by using the acrylic resins (A) and (B) in the above-mentioned range.

The flux of the present invention usually contains an activator, a thixotropic agent, an organic solvent, and the like. Other base resin may further be incorporated in such a range as not to impair the effect of the present invention.

Examples of the other base resin include styrene-maleic acid resin, epoxy resin, urethane resin, polyester resin, phenoxy resin, terpene resin, and rosin-based resins. Examples of the rosin include gum rosin, tall rosin, wood rosin, and derivatives of these rosins. Examples of these derivatives include polymerized rosin, acrylated rosin, hydrogenated rosin, disproportionated rosin, formylated rosin, rosin ester, rosin modified maleic acid resin, rosin modified phenol resin, and rosin modified alkyd resin.

Examples of the activator include amines (diphenylguanidine, naphthylamine, diphenylamine, triethanolamine, monoethanolamine, etc.), amine salts (polyamines such as ethylenediamine, organic acid salts of amine such as cyclohexylamine, ethylamine and diethylamine, and inorganic acid (mineral acids such as hydrochloric acid, and sulfuric acid) salts, organic acids (dicarboxylic acids such as succinic acid, adipic acid, glutaric acid, sebacic acid, and maleic acid; fatty acids such as myristic acid, palmitic acid, stearic acid, and oleic acid; hydroxy carboxylic acids such as lactic acid, dimethylolpropionic acid, and malic acid; benzoic acid, phthalic acid, trimellitic acid), amino acids (glycine, alanine, aspartic acid, glutamic acid, valine, etc.), and hydrohalogenic acid salts of aniline (aniline hydrobrominate, etc.).

Examples of the thixotropic agent include hydrogenated castor oil, beeswax, carnauba wax, stearic acid amide, and hydroxystearic acid ethylene bisamide.

Examples of the organic solvent include alcohol type solvents (ethyl alcohol, isopropyl alcohol, ethyl cellosolve, butyl carbitol, hexyl carbitol, etc.), ester type solvents (ethyl acetate, butyl acetate, etc.), and hydrocarbon type solvents (toluene, turpentine, etc.). Among others, isopropyl alcohol, butyl carbitol, and hexyl carbitol are preferred. Isopropyl alcohol has excellent volatility and solubility in the activator, and is suitably used for liquid flux or the like. Meanwhile, when the flux is mixed with solder alloy powder so as to be used as a solder paste composition, polyhydric alcohol ethers having a high boiling point, such as butyl carbitol and hexyl carbitol, are suitably used.

In the flux of the present invention, the contents of the acrylic resin (A), the acrylic resin (B), the other base resin, the activator, the thixotropic agent, and the organic solvent in the total amount of the flux are as follows.

Acrylic resin (A): 10 to 30% by mass, preferably 10 to 25% by mass;

Acrylic resin (B): 10 to 30% by mass, preferably 10 to 25% by mass;

Other base resin: 0 to 20% by mass, preferably 5 to 15% by mass;

Activator: 0 to 30% by mass, preferably 5 to 25% by mass;

Thixotropic agent: 0 to 13% by mass, preferably 1 to 8% by mass; and

Organic solvent: 0 to 35% by mass, preferably 10 to 30% by mass

Furthermore, the flux of the present invention may contain additives, such as an antioxidant, a chelating agent, an anti-rust agent, as necessary in such a range as not to impair the effect of the present invention. These additives may be added, for example, when mixing the flux and the solder alloy powder together.

(Solder Paste Composition)

The solder paste composition of the present invention contains the flux of the present invention and the solder alloy powder. The solder alloy powder is not particularly limited. Examples thereof include Sn—Pb alloy, alloy obtained by adding silver, bismuth, and indium to the Sn—Pb alloy, Sn—Ag type alloys, Sn—Cu type alloys, and Sn—Ag—Cu type alloys. In consideration of environmental impact, lead-free alloys, such as Sn—Ag type alloys, Sn—Cu type alloys, and Sn—Ag—Cu type alloys, are preferred. The mean particle size of the solder alloy powder is not particularly limited, but is preferably, for example, approximately 10 to 40 µm.

A mass ratio of the flux and the solder alloy powder (the flux:the solder alloy powder) is not particularly limited, but may be suitably set according to the intended use of the solder paste, or the like. For example, the mass ratio of approximately 8:92 to 15:85 is preferred.

The solder paste composition of the present invention is to be applied onto a substrate by the dispenser or screen printing when solder joining electronic device components or the like. After the application, preheating is conducted at approximately 150 to 200° C., and reflow is conducted at a maximum temperature of approximately 170 to 250° C. The application onto the substrate and the reflow may be conducted in the atmosphere or an inert gas atmosphere of nitrogen, argon, helium, or the like.

EXAMPLES

The present invention is specifically described below with reference to examples and comparative examples, but it should be construed that the present invention is in no way limited to the following examples.

<Synthesis of Acrylic Resin>

Synthesis Example 1

As a reaction solvent, 30 parts by mass of hexyl carbitol was loaded into a reaction vessel (glass flask) including a thermometer and a nitrogen introduction tube. This was heated to 120° C. while being stirred in a nitrogen atmosphere. Subsequently, a monomer solution was prepared by mixing 65 parts by mass of stearyl methacrylate as a monomer ingredient and 5 parts by mass of AIBN as a polymerization initiator. The monomer solution was dropped in the reaction vessel for two hours and was allowed to react at 120° C. After all the monomer solution was dropped, this was aged at 120° C. for two hours, thereby obtaining an acrylic resin (A1) (acid value: 0 mg KOH/g, weight average molecular weight (Mw): 10000, and glass transition temperature (Tg): 27° C.). The acid value and the weight average molecular weight were respectively measured with the following methods.

<Acid Value Measurement>

An acid value measurement was conducted according to acid value neutralization titration method of JIS 0070. A 1 g of resin as a sample was loaded into a conical flask, and 100 mL of solvent (a mixed solution of toluene and ethanol, and a mixing ratio of 1:1) and several drops of phenolphthalein solution (indicator) were added thereto so as to completely dissolve the sample. Thereafter, titration was conducted with 0.1 mol/L of potassium hydroxide ethanolic solution, and a time point when a light pink of the indicator was colored for 30 seconds was taken as a terminal point. The acid value was obtained using the following equation.

$$\text{Acid value} = (A \times f \times 5.611)/S$$

(wherein A is a titration quantity (mL), f is a factor of potassium hydroxide ethanolic solution, and S is a mass (g) of the sample.)

<Measurement of Weight Average Molecular Weight>

A molecular weight distribution of the resin was measured by gel permeation chromatography (GPC), and a weight average molecular weight was obtained.

Synthesis Examples 2-14 and Comparative Synthesis Examples 1-4

Acrylic resins (A2) to (A6), acrylic resins (B1) to (B8), and acrylic resins 1 to 4 were obtained in the same procedure as in Synthesis Example 1, except that ingredients illustrated in Table 1 were used in their respective proportions illustrated in Table 1. The acid value, Mw, and Tg of each of the obtained acrylic resins are illustrated in Table 1.

The acrylic resins (A1) to (A6) obtained in Synthesis Examples 1 to 6 are included in the acrylic resin (A), and the acrylic resins (B1) to (B8) obtained in Synthesis Examples 7 to 14 are included in the acrylic resin (B).

TABLE 1

| | Resin | Monomer ingredient (parts by mass) | | Polymerization initiator (parts by mass) | Mw | Tg (° C.) | Acid value (mgKOH/g) |
|---|---|---|---|---|---|---|---|
| Synthesis Example 1 | A1 | Methacrylate (70) | Methacrylic acid (0) | AIBN (5) | 12000 | 28 | 0 |
| Synthesis Example 2 | A2 | Methacrylate (69) | Methacrylic acid (1) | AIBN (5) | 12000 | 28 | 10 |
| Synthesis Example 3 | A3 | Methacrylate (67) | Methacrylic acid (3) | AIBN (5) | 12000 | 31 | 30 |
| Synthesis Example 4 | A4 | Methacrylate (65.8) | Methacrylic acid (4.2) | AIBN (5) | 12000 | 32 | 42 |
| Synthesis Example 5 | A5 | Methacrylate (64.8) | Methacrylic acid (5.2) | AIBN (5) | 12000 | 33 | 50 |
| Synthesis Example 6 | A6 | Methacrylate (62.8) | Methacrylic acid (7.8) | AIBN (5) | 12000 | 36 | 70 |
| Synthesis Example 7 | B1 | Acrylate (97) | Methacrylic acid (3) | Benzoate (5) | 8000 | −80 | 30 |
| Synthesis Example 8 | B2 | Acrylate (96) | Methacrylic acid (4) | Benzoate (5) | 8000 | −79 | 40 |
| Synthesis Example 9 | B3 | Acrylate (94.8) | Methacrylic acid (5.2) | Benzoate (5) | 8000 | −77 | 50 |
| Synthesis Example 10 | B4 | Acrylate (93.6) | Methacrylic acid (6.4) | Benzoate (5) | 8000 | −74 | 64 |
| Synthesis Example 11 | B5 | Acrylate (92.8) | Methacrylic acid (7.2) | Benzoate (5) | 8000 | −73 | 70 |
| Synthesis Example 12 | B6 | Acrylate (90.8) | Methacrylic acid (9.2) | Benzoate (5) | 8000 | −70 | 90 |
| Synthesis Example 13 | B7 | Acrylate (82.7) | Methacrylic acid (17.3) | Benzoate (5) | 8000 | −53 | 170 |
| Synthesis Example 14 | B8 | Acrylate (77.2) | Methacrylic acid (22.8) | Benzoate (5) | 8000 | −42 | 230 |
| Comparative Synthesis Example 1 | 1 | Methacrylate (62) | Methacrylic acid (8) | AIBN (5) | 12000 | 37 | 80 |
| Comparative Synthesis Example 2 | 2 | Acrylate (99) | Methacrylic acid (1) | Benzoate (5) | 8000 | −83 | 10 |
| Comparative Synthesis Example 3 | 3 | Acrylate (98) | Methacrylic acid (2) | Benzoate (5) | 8000 | −82 | 20 |
| Comparative Synthesis Example 4 | 4 | Acrylate (76) | Methacrylic acid (24) | Benzoate (5) | 8000 | −39 | 240 |

"Methacrylate" of the monomer ingredient is stearyl methacrylate.
"Acrylate" of the monomer ingredient is 2-ethylhexyl acrylate.
"Benzoate" of the polymerization initiator is t-butyl peroxybenzoate.
30 parts by mass of hexyl carbitol is used as a solvent in all Synthesis Examples.

<Preparation of Flux and Solder Paste Composition>

Each of Examples and Comparative Examples employed tributylamine hydrobromide (denoted by "HBr" in Tables 2 and 3) and adipic acid as the activator, castor wax (denoted by "wax" in Tables 2 and 3) as the thixotropic agent, and hexyl carbitol (denoted by "carbitol" in Tables 2 and 3) as the organic solvent.

Example 1

As illustrated in Table 2, 20% by mass of the acrylic resin (A1), 20% by mass of the acrylic resin (B1), 8% by mass of adipic acid, 0.5% by mass of tributylamine hydrobromide, 30% by mass of hexyl carbitol, and 6.5% by mass of castor wax were loaded in a vessel. The vessel was then heated to dissolve and mix these ingredients, and thereafter, the vessel was cooled to obtain flux. The resultant flux and solder alloy powder (Sn-3.0Ag-0.5Cu) were mixed together in the ratio of the flux to the solder metal powder, 11:89 (mass ratio), thereby obtaining a solder paste composition.

Examples 2-23 and Comparative Examples 1-15

Individual fluxes were obtained in the same procedure as in Example 1, except that ingredients illustrated in Tables 2 and 3 were used in their respective proportions illustrated in Tables 2 and 3. Subsequently, individual solder paste compositions were respectively obtained in the same procedure as in Example 1, except for respectively using the resultant fluxes.

The solder paste compositions obtained in these Examples and Comparative Examples were used to evaluate in terms of (1) printability and (2) wettability of the solder paste, and (3) crack resistance of the flax residue with the following methods.

(1) Printability of Solder Paste

Using a substrate for evaluating printability (a glass epoxy substrate having a 0.5 mm pitch of 10×10 pins and a 0.25 mmϕ opening pattern of BGA (ball grid array), continuous printability for 20 pieces was evaluated according to the following criteria by using a mask having the corresponding thickness of 150 μm.

Symbol "○" denotes the case where less than 20 percent of the 10×10 pins were fractured on all substrates; and Symbol "×" denotes the case where 20 percent or more of the 10×10 pins were fractured on all substrates.

(2) Wettability

The solder paste composition was printed on a substrate having thereon a QFP (quad flat package) pattern of 0.8 mm pitch by using a metal mask having the same pattern and a thickness of 200 μm. Preheating at 175±5° C. for 80±5 seconds in the atmosphere was carried out within 10 minutes after the printing, followed by reflow at a maximum temperature of 235±5° C. A solder ball occurrence situation serving as an index was observed by counting the number of solder balls occurred around 80 pads (80 soldering portions) with a stereoscopic microscope at ×20 magnification. It was evaluated as having excellent wettability when the number of solder balls was 10 or less.

Symbol "○" denotes the case where the number of solder balls is 10 or less; and

Symbol "×" denotes the case where the number of solder balls exceeds 10.

(3) Crack Resistance of Flux Residue

The substrate after subjected to the above wettability test was used as a test piece. The test piece was subjected to a cooling/heating cycle load under conditions of 1000 cycles with the range from −40° C.×30 minutes to 125° C.×30 minutes as one cycle. Thereafter, residue crack occurrence states at the soldering portions on the substrate were visually observed and evaluated according to the following criteria.

Symbol "○" denotes the case where no crack was observed; and

Symbol "×" denotes the case where cracks were observed.

TABLE 2

| | | Base resin | | | Thixotropic | Organic | | | |
|---|---|---|---|---|---|---|---|---|---|
| | | Resin(A) (% by mass) | Resin(B) (% by mass) | Activator (% by mass) | agent (% by mass) | solvent (% by mass) | Printability | Wettability | Crack Resistance |
| Examples | 1 | A1 (20) | B1 (20) | Adipic acid (8) HBr (0.5) | Wax (6.5) | Carbitol (30) | ○ | ○ | ○ |
| | 2 | A1 (20) | B2 (20) | Adipic acid (8) HBr (0.5) | Wax (6.5) | Carbitol (30) | ○ | ○ | ○ |
| | 3 | A1 (20) | B3 (20) | Adipic acid (8) HBr (0.5) | Wax (6.5) | Carbitol (30) | ○ | ○ | ○ |
| | 4 | A1 (20) | B6 (20) | Adipic acid (8) HBr (0.5) | Wax (6.5) | Carbitol (30) | ○ | ○ | ○ |
| | 5 | A1 (20) | B7 (20) | Adipic acid (8) HBr (0.5) | Wax (6.5) | Carbitol (30) | ○ | ○ | ○ |
| | 6 | A1 (20) | B8 (20) | Adipic acid (8) HBr (0.5) | Wax (6.5) | Carbitol (30) | ○ | ○ | ○ |
| | 7 | A2 (20) | B1 (20) | Adipic acid (8) HBr (0.5) | Wax (6.5) | Carbitol (30) | ○ | ○ | ○ |
| | 8 | A2 (20) | B2 (20) | Adipic acid (8) HBr (0.5) | Wax (6.5) | Carbitol (30) | ○ | ○ | ○ |
| | 9 | A2 (20) | B3 (20) | Adipic acid (8) HBr (0.5) | Wax (6.5) | Carbitol (30) | ○ | ○ | ○ |
| | 10 | A3 (20) | B3 (20) | Adipic acid (8) HBr (0.5) | Wax (6.5) | Carbitol (30) | ○ | ○ | ○ |
| | 11 | A3 (20) | B5 (20) | Adipic acid (8) HBr (0.5) | Wax (6.5) | Carbitol (30) | ○ | ○ | ○ |
| | 12 | A3 (20) | B6 (20) | Adipic acid (8) HBr (0.5) | Wax (6.5) | Carbitol (30) | ○ | ○ | ○ |
| | 13 | A3 (20) | B7 (20) | Adipic acid (8) HBr (0.5) | Wax (6.5) | Carbitol (30) | ○ | ○ | ○ |
| | 14 | A3 (20) | B8 (20) | Adipic acid (8) HBr (0.5) | Wax (6.5) | Carbitol (30) | ○ | ○ | ○ |
| | 15 | A4 (20) | B4 (20) | Adipic acid (8) HBr (0.5) | Wax (6.5) | Carbitol (30) | ○ | ○ | ○ |
| | 16 | A4 (20) | B6 (20) | Adipic acid (8) HBr (0.5) | Wax (6.5) | Carbitol (30) | ○ | ○ | ○ |
| | 17 | A5 (20) | B5 (20) | Adipic acid (8) HBr (0.5) | Wax (6.5) | Carbitol (30) | ○ | ○ | ○ |
| | 18 | A5 (20) | B6 (20) | Adipic acid (8) HBr (0.5) | Wax (6.5) | Carbitol (30) | ○ | ○ | ○ |
| | 19 | A5 (20) | B7 (20) | Adipic acid (8) HBr (0.5) | Wax (6.5) | Carbitol (30) | ○ | ○ | ○ |
| | 20 | A5 (20) | B8 (20) | Adipic acid (8) HBr (0.5) | Wax (6.5) | Carbitol (30) | ○ | ○ | ○ |
| | 21 | A6 (20) | B6 (20) | Adipic acid (8) HBr (0.5) | Wax (6.5) | Carbitol (30) | ○ | ○ | ○ |
| | 22 | A6 (20) | B7 (20) | Adipic acid (8) HBr (0.5) | Wax (6.5) | Carbitol (30) | ○ | ○ | ○ |
| | 23 | A6 (20) | B8 (20) | Adipic acid (8) HBr (0.5) | Wax (6.5) | Carbitol (30) | ○ | ○ | ○ |

15% by mass of gum rosin is further included in the base resin all Examples.
"HBr" of the activator is tributylamine hydrobromide.
"Wax" of the thixotropic agent is castor wax.
"Carbitol" of the organic solvent is hexyl carbitol.

TABLE 3

| | | Base resin | | | Thixotropic | Organic | | | |
| | | Resin(A) (% by mass) | Resin(B) (% by mass) | Activator (% by mass) | agent (% by mass) | solvent (% by mass) | Printability | Wettability | Crack Resistance |
|---|---|---|---|---|---|---|---|---|---|
| Comparative Examples | 1 | A1 (20) | Resin 2 (20) | Adipic acid (8) HBr (0.5) | Wax (6.5) | Carbitol (30) | X | ○ | X |
| | 2 | A1 (20) | Resin 4 (15) | Adipic acid (8) HBr (0.5) | Wax (6.5) | Carbitol (35) | ○ | ○ | X |
| | 3 | A2 (20) | Resin 3 (20) | Adipic acid (8) HBr (0.5) | Wax (6.5) | Carbitol (30) | X | ○ | ○ |
| | 4 | A3 (20) | B2 (20) | Adipic acid (8) HBr (0.5) | Wax (6.5) | Carbitol (30) | X | ○ | ○ |
| | 5 | A3 (20) | Resin 4 (15) | Adipic acid (8) HBr (0.5) | Wax (6.5) | Carbitol (35) | ○ | ○ | X |
| | 6 | A5 (20) | B3 (20) | Adipic acid (8) HBr (0.5) | Wax (6.5) | Carbitol (30) | X | ○ | ○ |
| | 7 | A5 (20) | Resin 4 (15) | Adipic acid (8) HBr (0.5) | Wax (6.5) | Carbitol (35) | ○ | ○ | X |
| | 8 | A6 (20) | B5 (20) | Adipic acid (8) HBr (0.5) | Wax (6.5) | Carbitol (30) | X | ○ | ○ |
| | 9 | A6 (20) | Resin 4 (10) | Adipic acid (8) HBr (0.5) | Wax (6.5) | Carbitol (40) | ○ | ○ | X |
| | 10 | Resin 1 (20) | B6 (20) | Adipic acid (8) HBr (0.5) | Wax (6.5) | Carbitol (30) | X | ○ | X |
| | 11 | Resin 1 (20) | B7 (15) | Adipic acid (8) HBr (0.5) | Wax (6.5) | Carbitol (35) | ○ | ○ | X |
| | 12 | Resin 1 (20) | B8 (20) | Adipic acid (8) HBr (0.5) | Wax (6.5) | Carbitol (30) | ○ | ○ | X |
| | 13 | A1 (40) | — | Adipic acid (8) HBr (0.5) | Wax (6.5) | Carbitol (30) | ○ | ○ | X |
| | 14 | — | B4 (20) | Adipic acid (8) HBr (0.5) | Wax (6.5) | Carbitol (30) | X | ○ | ○ |
| | 15 | — | — | Adipic acid (8) HBr (0.5) | Wax (10) | Carbitol (66.5) | X | X | X |

15% by mass of gum rosin is further included in the base resin all Comparative Examples.
"HBr" of the activator is tributylamine hydrobromide.
"Wax" of the thixotropic agent is castor wax.
"Carbitol" of the organic solvent is hexyl carbitol.
Resins 1 to 4 are acrylic resins whose acid values are outside the range.

It can be seen from Table 2 that the solder paste compositions of Examples 1 to 23 have excellent results in terms of all of (1) the printability and (2) the wettability of the solder paste, and (3) the crack resistance of the flux residue. On the other hand, it can be seen from Table 3 that the solder paste compositions of Comparative Examples 1 to 15 are poor in terms of at least one of (1) the printability and (2) the wettability of the solder paste, and (3) the crack resistance of the flux residue.

The invention claimed is:

1. A soldering flux comprising:
   an acrylic resin (A) as a base resin which has an acid value of 10 to 70 and is obtained by polymerization of a monomer mixture consisting of alkyl (meth)acrylate having a straight-chain alkyl group having carbon atoms of 12 to 23, and an organic acid monomer; and
   an acrylic resin (B) as a base resin which has an acid value of 30 to 230 and is obtained by polymerization of a monomer mixture containing alkyl (meth) acrylate having an alkyl group having carbon atoms of 6 to 10,
   wherein the acid value of the acrylic resin (B) is higher than the acid value of the acrylic resin (A), and
   a difference between the acid values of these two resins (A) and (B) is 15 or more.

2. The soldering flux according to claim 1, wherein a content of the acrylic resin (A) is 10 to 30% by mass in a total amount of flux, and a content of the acrylic resin (B) is 10 to 30% by mass in the total amount of flux.

3. The solder flux according to claim 1, wherein the acrylic resin (A) is an acrylic resin obtained by polymerization of a monomer mixture containing at least 50% by mass of alkyl (meth) acrylate having a straight-chain alkyl group having carbon atoms of 12 to 23.

4. The soldering flux according to claim 1, wherein the acrylic resin (B) is an acrylic resin obtained by polymerization of a monomer mixture containing at least 50% by mass of alkyl (meth)acrylate having an alkyl group having carbon atoms of 6 to 10.

5. The soldering flux according to claim 1, wherein the acrylic resin (A) has a weight average molecular weight of 30000 or less.

6. The soldering flux according to claim 1 wherein the acrylic resin (B) has a weight average molecular weight of 30000 or less.

7. A solder paste composition comprising the soldering flux according to claim 1, and solder alloy powder.

8. The soldering flux according to claim 1, wherein the acrylic resin (A) has an acid value of 10 to 30.

9. The soldering flux according to claim 1, wherein the acrylic resin (A) has an acid value of 30 to 70.

10. The soldering flux according to claim 1, wherein the acrylic resin (A) has an acid value of 30 to 50.

11. The soldering flux according to claim 1, wherein the acrylic resin (A) has an acid value of 50 to 70.

12. The soldering flux according to claim 1, wherein the acrylic resin (A) has an acid value of 20 to 50.

13. The soldering flux according to claim 1, wherein the acrylic resin (B) has an acid value of 30 to 40.

14. The soldering flux according to claim 1, wherein the acrylic resin (B) has an acid value of 170 to 230.

15. The soldering flux according to claim 1, wherein the acrylic resin (B) has an acid value of 150 to 170.

16. The soldering flux according to claim 1, wherein the organic acid monomer is acrylic acid or methacrylic acid.

17. The soldering flux according to claim 1, wherein the straight-chain alkyl group of the alkyl (meth) acrylate of resin (A) has 12-20 carbon atoms.

18. A method for solder joining electronic device components comprising applying the soldering flux according to claim 1 onto one or more components that are to be solder joined.

19. A method according to claim 18, wherein the application of the soldering flux is by printing or by a dispenser.

* * * * *